United States Patent [19]
Leduc

[11] Patent Number: 4,951,108
[45] Date of Patent: Aug. 21, 1990

[54] LATERAL TRANSISTOR WITH ELONGATED EMITTER

[75] Inventor: Pierre Leduc, Colleville-Montgomery, France

[73] Assignee: U.S. Philips Corp., New York, N.Y.

[21] Appl. No.: 291,928

[22] Filed: Dec. 28, 1988

[30] Foreign Application Priority Data

Dec. 30, 1987 [FR] France .............................. 87 18388

[51] Int. Cl.⁵ .............................................. H01L 29/72
[52] U.S. Cl. ...................................... 357/36; 357/35; 357/55; 357/68
[58] Field of Search .......................... 357/36, 35, 55, 68

[56] References Cited

U.S. PATENT DOCUMENTS 4,231,059  10/1980  Hower et al. .......................... 357/36
4,654,687  3/1987  Hébert ................................... 357/36

Primary Examiner—Edward J. Wojciechowicz
Attorney, Agent, or Firm—Steven R. Biren

[57] ABSTRACT

The invention relates to an integrated circuit having a lateral transistor, whose emitter region has a depth and a doping level such that the diffusion length of the minority charge carriers vertically injected into this region is greater than or equal to the thickness of the said region, the ratio between the surface of the emitter region and that of the electrical connection emitter zone being at least equal to 20. The current amplification $\beta$ of such a transistor is considerably increased by giving the emitter region an elongate shape in a longitudinal direction, the ratio between the largest longitudinal dimension and the largest transversal dimension being at least equal to 5.

8 Claims, 4 Drawing Sheets

LATERAL TRANSISTOR WITH ELONGATED EMITTER

BACKGROUND OF THE INVENTION

The invention relates to an integrated circuit having a lateral transistor comprising emitter and collector regions of a first conductivity type laterally spaced apart and extending from the surface of a region of a second conductivity type opposite to the first type, the lateral space of said region of the second type situated between the emitter and collector regions forming the base of the transistor and comprising electrical emitter and collector connections, each of which has at least one zone in electrical contact through windows of an insulating layer with the emitter region and with the said collector region, respectively, the emitter region having a depth and a doping level such that the diffusion length of the minority charge carriers vertically injected into the latter region in greater than or equal to the thickness of the said region, while the ratio between the surface of the said emitter region and that of the said electrical connection emitter zone is at least equal to 20.

Such a circuit has been described in European Patent Application No. 228-748 entitled "Procede de fabrication d'un transistor lateral integre et circuit integre le comprenant".

The lateral transistor of the kind described in this prior art document has an amplification improved by a factor that can reach about 1.4 with respect to the lateral transistors manufactured previously.

Thus, lateral transistors can be obtained, whose current amplification is of the order of 10.

However, one of the crucial problems met in lateral transistors is that their current amplification remains much lower than the current amplification of vertical transistors, which may be of the order of 50 to 100.

SUMMARY OF THE INVENTION

The present invention has for its object to provide an integrated circuit having a lateral transistor, whose current amplification approaches that of vertical transistors, for example an amplification of the order of 40.

The basic idea of the invention consists in breaking with the symmetry principle governing the geometry of the emitters of lateral transistors. According to this principle, the emitter contact lies at a short distance from the emitter-base junction, which is supposed to improve the efficaciousness of the lateral injection. Now the Applicant has been able to prove that in a surprising manner a very high current amplification could be obtained with a geometry in which a considerable part of the emitter-base junction was located at a great distance from the emitter contact in at least one preferential direction.

The integrated circuit according to the invention is thus characterized in that the emitter region has at least one elongate branch in a first so-called longitudinal direction, the ratio between the largest dimension in the said longitudinal direction and the largest width of the said transversal branch being at least equal to 5.

According to an advantageous embodiment, the emitter region is lozenge-shaped.

According to an embodiment improved with regard to the maximum admissible current, the emitter region has at least one strip, for example in the form of lozenges joined to each other in the longitudinal direction and a number of bond pads.

According to a preferred embodiment, the emitter region comprises at least two branches in at least a first and a second so-called longitudinal direction. In order to increase the maximum admissable current, the emitter region can have at least two strips in at least the said first and second longitudinal directions, each strip having a plurality of bond pads. In the case in which the emitter region has at least four of such strips, at least one collector island can be arranged in the space existing between the strips.

BRIEF DESCRIPTION OF THE DRAWING

The invention will be understood more clearly upon reading the following description given by way of non-limitative example with reference to the drawings, in which:

FIGS. 2a and 2b show in plan view and in sectional view taken on CC, respectively, an advantageous embodiment according to the invention, FIG. 2c showing an enlarged detail of FIG. 2a;

DESCRIPTION OF THE PREFERRED EMBODIMENTS

Figure 1A:
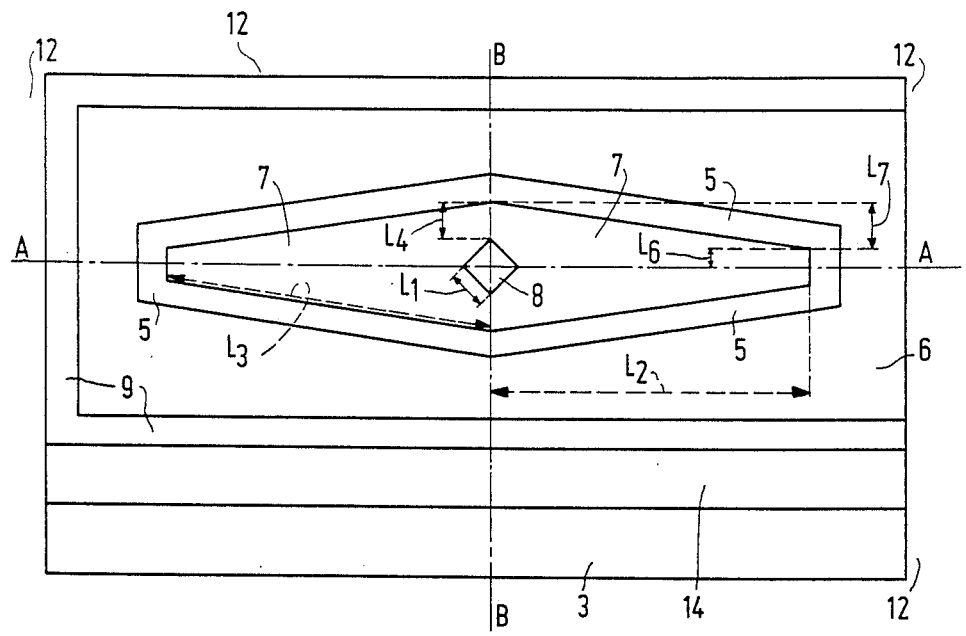
FIG. 1a to 1c show in plan view, in sectional view taken on AA and in sectional view taken on BB, respectively, an embodiment of the invention.
Figure 1B:
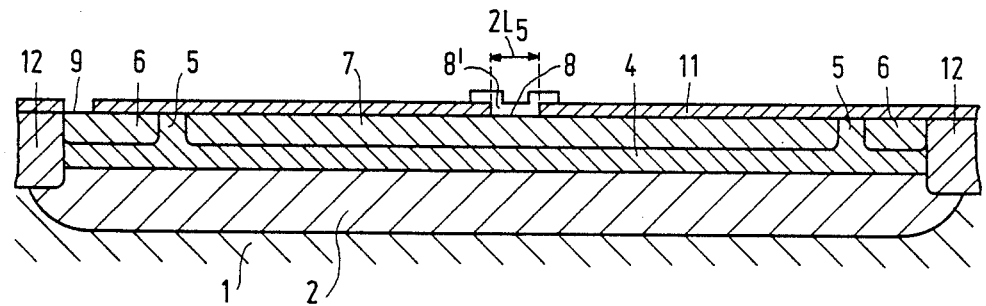
Figure 1C:
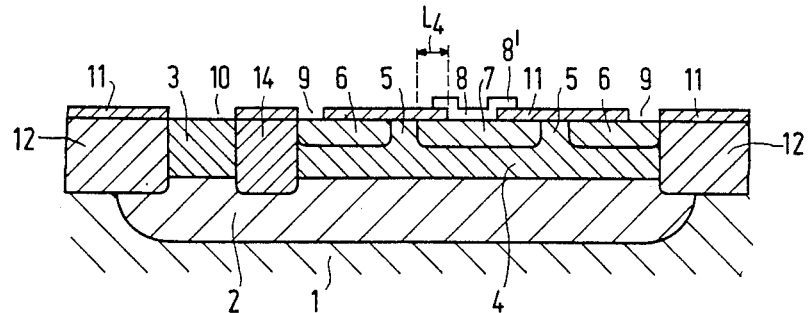

According to FIGS. 1a to 1c, lateral transistor in accordance with the invention comprises an emitter region 7 of elongate form, in this case in the form of a truncated lozenge, at whose center an opening 8 of a thin oxide layer 11 is provided serving as emitter contact connection.

The integrated circuit comprises a substrate 1, for example of the p-type, in one region of which a buried highly doped layer 2 of the opposite type (i.e. the n+type) is provided. The substrate 1 is covered by an epitaxial layer of the opposite type (i.e. the n-type) having localized islands, in this case 4 and 3, forming an island for the lateral transistor and a base contact island, respectively, electrically connected to each other by the highly doped buried layer 2. The island 3 has a general rectangular form and is separated from the island 4 by a deep oxide region 14 extending as far as the buried layer 2. The island 4 is also of rectangular shape and is bounded on three sides by a deep oxide region 12 extending as far as the buried layer 2 and on the fourth side by the deep oxide region 14. The island 3 is bounded on its three sides not adjacent to the island 4 by the deep oxide region 12, which also bounds the assembly of the two islands 3 and 4.

The island 4 comprises regions, here of the p-type, forming the emitter region 7 and the collector region 6. The collector region 6 is externally bounded by the deep oxide layers 12 and 14. The base region 5 is constituted by the n-type region of the island 4, which subsists between the regions 6 and 7.

The opening 8 is in this case of square cross-section and its diagonals are arranged along the axes of the lozenge constituting the emitter 7. A bond pad 8' shown in FIGS. 1b and 1c permits of obtaining the emitter contact connection. The side of the opening 8 has the value $L_1$ and its diagonal $2L_5$ has the value $L_1\sqrt{2}$.

Let it be assumed that $L_2$ is the value of the main half diagonal of the lozenge and $L_4+L_5$ is the value of the other half diagonal of the lozenge, where $L_5$ has the value $L/2_1\sqrt{2}$.

Let it be assumed that $L_3$ is the length of one side of the lozenge and $L_6$ is the half length of the said side truncating the end of the lozenge so that:

$$L_4+L_5=L_6+L_7 \quad (1)$$

and $$L_3^2=L_2^2+L_7^2 \quad (2)$$

The emitter region 7 has a depth h and a doping level such that the diffusion length of the minority charge carriers vertically injected into the latter region is greater than or equal to the thickness of this region.

$J_1$ designates the lateral injection current density of the minority charge carriers in the base 5, $J_m$ designates the vertical injection current density of the minority charge carriers under the emitter contact zone (8) and $J_o$ designates the vertical injection current density of the minority charge carriers under the part of the oxide layer 11 covering the emitter region 7.

The Applicant has been able to show that the expression of the current amplification $\beta$ of the lateral transistor can be presented to a first approximation in the form:

$$\beta = \frac{I_C}{I_B} = \frac{I_1}{I_m+I_o} = \frac{4J_1(L_3+L_6)h}{J_m L_1^2 + 4J_o\left[L_2\left(L_6+\frac{L_7}{2}\right)-\frac{L_1^2}{4}\right]}.$$

Figure 3:
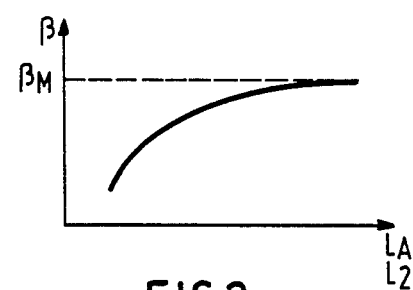
FIG. 3 shows the variation of the amplification curve of a device according to the invention.

If the values of $L_1$, $L_4$ and $L_6$ are fixed, for example, at the minimum values permitted by the method and if the value $L_2$ is caused to vary, a curve of amplification $\beta$ is obtained, whose variation is shown in FIG. 3. The amplification $\beta$ increases with the value of $L_2$ and tends to a maximum value $\beta_M$ when $L_2$ tends to the infinite. There is:

$$\beta = \frac{\frac{4J_1}{J_o} h(L_6+\sqrt{L_2^2+L_7^2})}{\left(\frac{J_m}{J_o}-1\right)L_1^2 + 4L_2\left(L_6+\frac{L_7}{2}\right)}$$

$$\beta_M = \frac{\frac{J_1}{J_o}h}{L_6+\frac{L_7}{2}}; \quad (3)$$

with $J_1/J_o h=270$ μm, $L_1=3$ μm, $L_4=2$ μm and $L_6=2$ μm, there is $\beta_M=270/3.05\beta 89$.

According to this geometry, the value of the amplification increases constantly when the ratio between the emitter contact surface and the emitter region surface increases. This result is completely surprising for two reasons. On the one hand, it shows a particular case in which the value of the amplification does not pass through a maximum in contrast with the contents of the French Patent Application 85 19479 mentioned above and on the other hand the maximum value of the amplification $\beta_M$ is several times higher than that which could be obtained according to the aforementioned Application.

In fact, according to this prior art document, there is:

$$\beta_{opt} = \frac{J_1 h}{2J_o} \times \frac{1}{L_1\sqrt{\frac{J_m}{J_o}-1}}$$

with $J_m/J_o=35$ and the same values as before for $L_1$ and $J_1/J_o$ h, there is $\beta_{opt}\beta 7.8$.

The comparison of the formulae giving the maximum amplifications in both cases, $\beta_M$ and $\beta_{opt}$, respectively, show that according to the present invention the maximum amplification $\beta_M$ depends only upon the ratio $J_1/J_o$.

In other words, the amplification of the transistor is practically solely the consequence of the lateral injection induced by the injection under the oxide, this injection under the oxide being itself the consequence of the injection under the emitter contact region. Just the elongate form of the emitter in a privileged direction permits of fully utilizing this phenomenon of injection under the oxide, which was generally perceived as being an undesirable phenomenon.

Figure 2A:
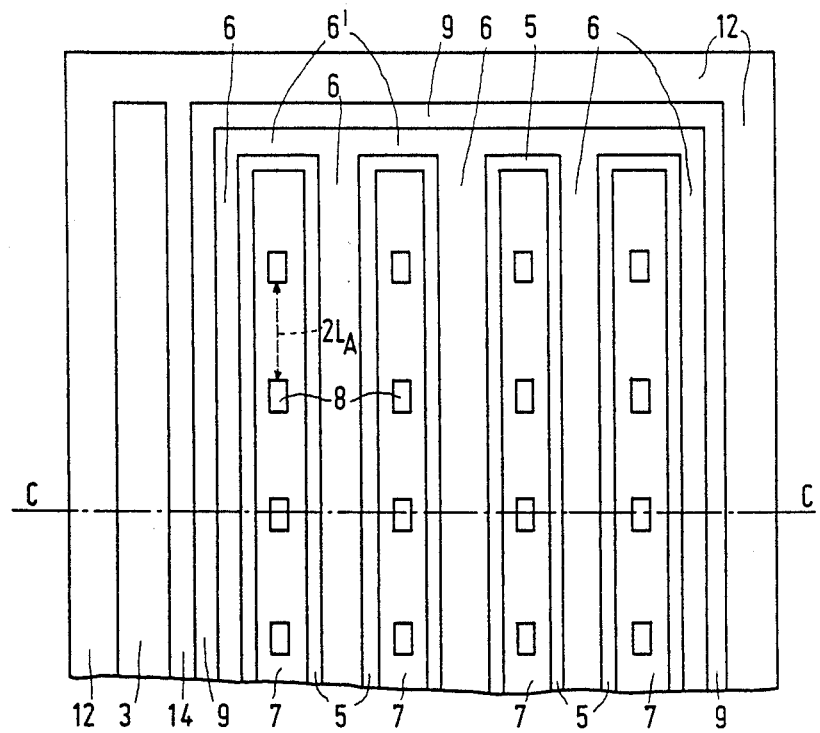
Figure 2B:
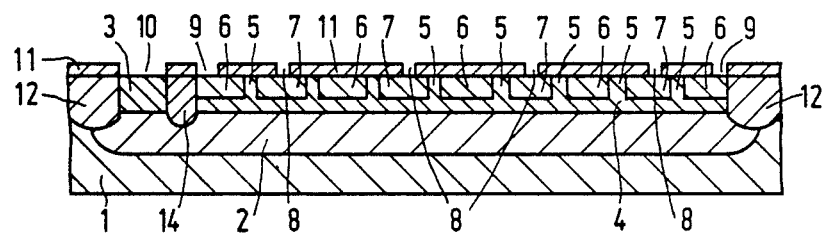
Figure 2C:
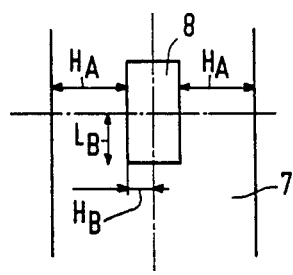

According to FIGS. 2a and 2c, the emitter 7 comprises a plurality of strips 7, each strip comprising an emitter contact strip forming a plurality of contacts through openings 8. The bond pads 8' (not shown) are interconnected by conductive strips, which are themselves interconnected. The other elements: the substrate 1, the buried layer 2, the islands 3 and 4 etc., are provided with the same reference numerals as in FIGS. 1a to 1c.

More particularly, this structure of strips becomes manifest (cf. the sectional view CC of FIG. 2b) by a succession of emitter region strips 7 and collector region strips 6 separated by base region strips 5.

At the end of the base region strips, the collector region strips 6 are interconnected by sections 6'.

Let it be assumed that $2L_A$ is the distance between two openings 8, that $H_A$ is the distance separating the edge of an opening 8 from the edge of the corresponding emitter strip 7, that $L_B$ is the half length of an opening 8 and that finally $H_B$ is the half width of an opening 8.

The current amplification $\beta$ can then be written as:

$$\beta = \frac{I_C}{I_B} = \frac{(L_A+L_B)J_1 h}{H_B L_B J_m + [(H_A+H_B)(L_A+L_B)-H_B L_B]J_o}$$

If the values of $H_A$, $H_B$ and $L_B$ are fixed, for example, at the minimum values permitted by the method and if the value of $L_A$ is caused to vary, a curve of amplification $\beta$ is obtained whose variation is shown in FIG. 3. The amplification $\beta$ increases with the value of $L_A$ and tends to a maximum value $B_M$ when $L_2$ tends to the infinite. It should be noted that the curves $\beta(L_2)$ and $\beta(L_A)$ cannot by superimposed, FIG. 3 giving only the variation of these curves. Likewise, the values $\beta_M$ are not rigorously the same in both cases:

There is: $\beta = \dfrac{J_1/J_0(L_A + L_B)h}{(J_m/J_0 - 1)H_B L_B + (H_A + H_B)(L_A + L_B)}$ $\beta_M = \dfrac{I_C}{I_B} = \dfrac{J_1 h}{J_0(H_A + H_B)}$ with $H_A = 2\ \mu$ and $H_B = 1\ \mu$, then there is: $\beta_M = 90$.

In practice, the current amplification is limited by the emitter resistance induced in the case of FIGS. 1a to 1c by the length of the emitter and in the case of FIGS. 2a to 2b by the separation between the emitter contact regions.

In fact, in both of these cases, the emitter resistance tends to reduce the maximum admissible current, the current amplification beginning to drop from a given current level. Therefore, in the first case the length of the lozenges and in the second case the separation between the emitter contacts must be chosen so as to conciliate a high amplification with an acceptable emitter resistance. The structure comprising several parallel strips permits of multiplying the maximum current of the transistor. This structure is therefore particularly interesting and permits of obtaining in general a better optimization than a structure having a single strip. On the contrary, a structure comprising a single emitter strip is interesting for operations at low or very low current, for which only the current amplification of the transistor is of importance.

Now a few examples will be given to show which amplification values can be obtained in practice. The formulae for calculation of the amplification given above use a simplified theoretical model;

First Case

Emitter in the form of a truncated lozenge, same values of $J_1/J_0$, $L_1$, $L_4$ and $L_6$ as in the preceding example and $J_m/J_0 = 35;$ for
$L_2 = 10\ \mu m$ there is $\beta = 26;$
$L_2 = 20\ \mu m$ there is $\beta = 43$.

In order to obtain an improved high amplification, it is considered that it is necessary that:

$L_2 \geq 5(L_4 + L_5).$

Second Case

Emitter having one or several strips; same values of $H_A$ and $H_B$ as before and $J_m/J_0 = 35;$ $L_B = 2.5\ \mu m;$ for $L_A = 10\ \mu m$ there is $\beta = 27.5;$
$L_A = 20\ \mu m$ there is $\beta = 40$.

Figure 4:
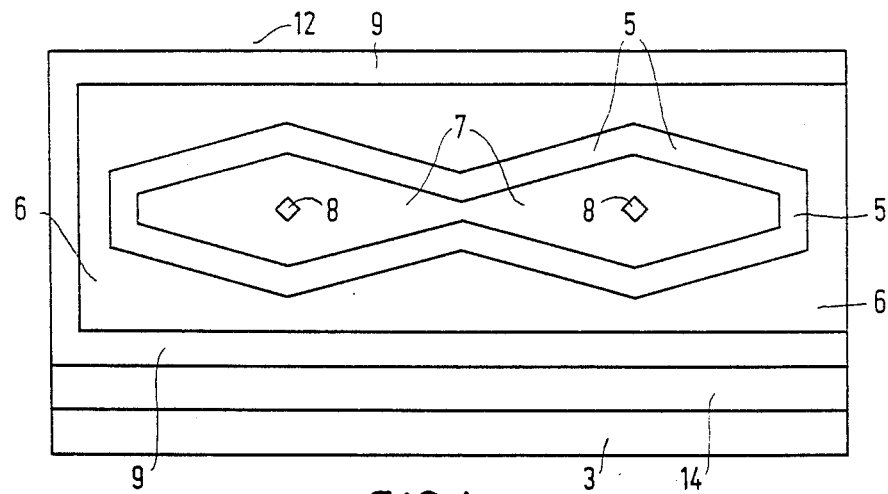
FIG. 4 shows another embodiment according to the invention.

FIG. 4 shows a variation of the invention, in which the emitter comprises a strip constituted by two truncated lozenges joined to each other.

Figure 5A:
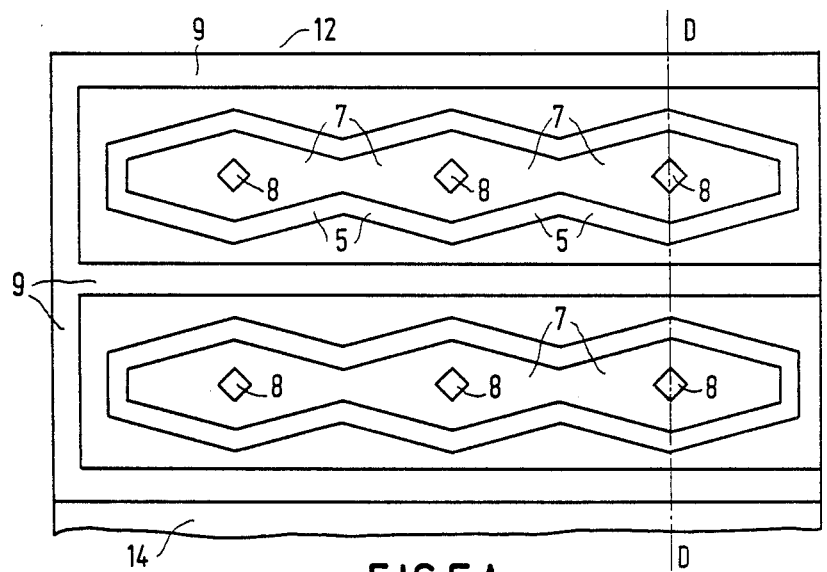
FIGS. 5a and 5b show a variation of the preferred embodiment according to the invention.
Figure 5B:
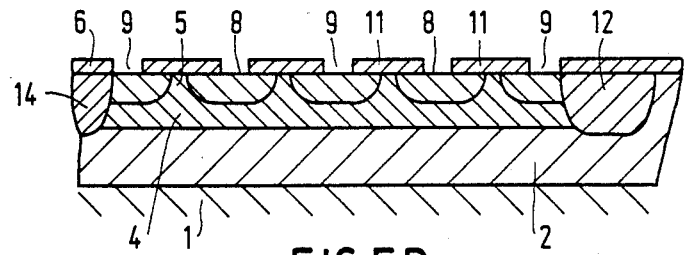

FIGS. 5a and 5b show another variation of the invention, in which the emitter comprises two strips each constituted by several truncated lozenges joined to each other, in this case a number of three per strip.

These two variations permit an amplification slightly improved with the same width with respect to rectilinear strips.

Figure 6:
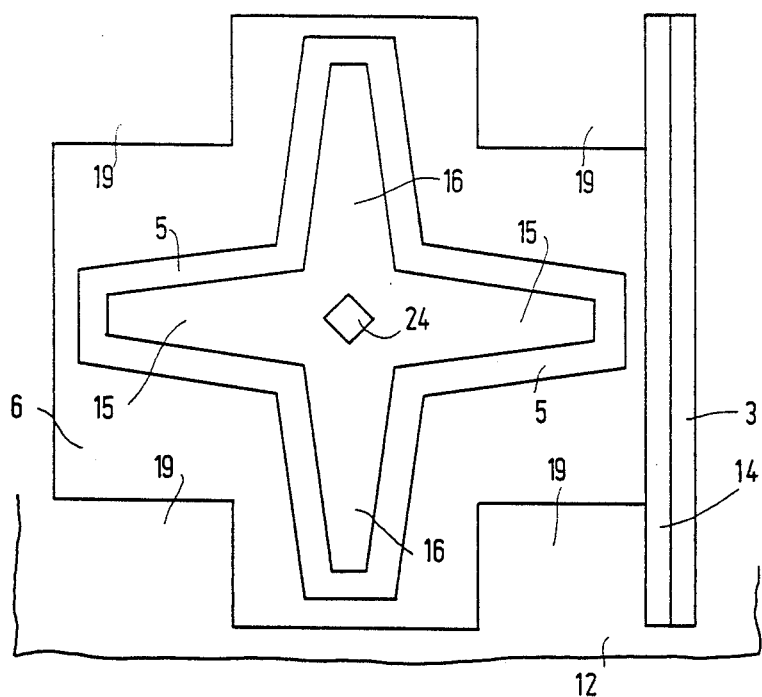
FIGS. 6 and 7 show two variations of the preferred embodiment according to the invention.

According to FIG. 6, the emitter comprises two branches 15 and 16 arranged in two so-called longitudinal directions, at whose intersection point an emitter contact 24 is provided. The two branches 15 and 16 are shown here as two orthogonal lozenges having the same centre. The perimeter of the emitter is enclosed by the base region 5 enclosed in turn by the collector region 6, which comprises an emitter contact connection zone 19. As in the preceding embodiments, deep oxide layer 14 separates the island 3 serving as the base contact connection.

This structure having two (or more) branches permits of limiting the volume while permitting a further reduced emitter resistance, which permits of maintaining the high value of the amplification at higher currents.

This arrangement in several directions further has the advantage that it is suitable for a realization in check pattern in two or more directions permitting of increasing the current and hance power possibilities.

Figure 7:
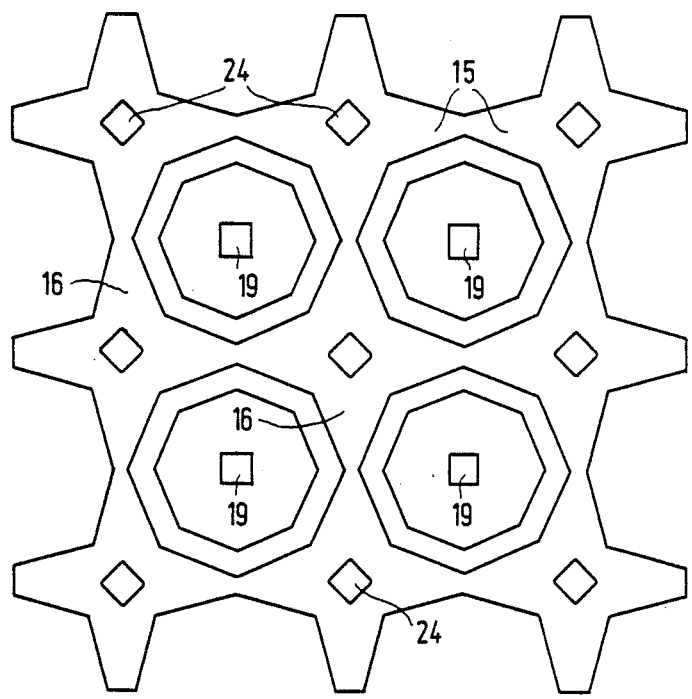

An embodiment is shown in FIG. 7, in which elementary structures comprising two branches according to FIG. 6 are assembled by the end of the branches constituting in turn strips arranged in the two longitudinal directions. When at least four of such strips exist, at least one collector island can be arranged in the space existing between the strips. FIG. 7 shows six strips and four islands. Each island has a collector contact 19.

What is claimed is:

1. An integrated circuit having a lateral transistor comprising emitter and collector regions of a first conductivity type laterally spaced apart and extending from the surface of a region of a second conductivity type opposite to the first type, the lateral space of said region of the second type situated between the emitter and collector regions forming the base of the transistor, and comprising electrical emitter and collector connections, each of which has at least one zone in electrical contact through windows of an insulating layer with the emitter region and with the said collector region, respectively, the emitter region having a depth and a doping level such that the diffusion length of the minority charge carriers vertically injected into the latter region during operation is greater than or equal to the thickness of said region, the ratio between the surface of the said emitter region and that of the said electrical connection emitter zone being at least equal to 20, characterized in that the emitter region has at least one elongate branch in a first longitudinal direction, the ratio between the largest dimension in the said longitudinal direction and the largest width of said transversal branch being at least equal to 5.

2. An integrated circuit as claimed in claim 1, characterized in that the emitter region is in the form of a lozenge.

3. An integrated circuit as claimed in claim 1 or 2, characterized in that the emitter region "(7)" has at least one strip and in that the electrical connection to the emitter zone comprises a plurality of bond pads.

4. An integrated circuit as claimed in claim 3, characterized in that it comprises at least one strip in the form of lozenges joined together in the longitudinal direction.

5. An integrated circuit as claimed in claim 4, characterized in that it comprises a bond pad for each lozenge of the strip.

6. An integrated circuit as claimed in claim 1, characterized in that the emitter region comprises at least two branches at least one first and one second longitudinal direction.

7. An integrated circuit as claimed in claim 6, characterized in that the emitter region comprises at least two strips in said first and second longitudinal directions, each strip having a plurality of emitter bond pads.

8. An integrated circuit as claimed in claim 7, characterized in that the emitter region comprises at least four strips and at least one collector island arranged in the space between the strips.

* * * * *